US006865186B1

(12) United States Patent
Jackson et al.

(10) Patent No.: US 6,865,186 B1
(45) Date of Patent: **\*Mar. 8, 2005**

(54) MULTIPLE MESSAGE MULTILEVEL ANALOG SIGNAL RECORDING AND PLAYBACK SYSTEM HAVING MEMORY ARRAY CONFIGURABLE FOR ANALOG AND DIGITAL STORAGE AND SERIAL COMMUNICATION

(75) Inventors: Geoffrey B. Jackson, Campbell, CA (US); Saleel V. Awsare, Redwood City, CA (US); Ming-Bing Chang, Santa Clara, CA (US); Peter Holzmann, Campbell, CA (US); Oliver Chihkuang Kao, Cupertino, CA (US); Hung-Chuan Pai, San Jose, CA (US); Carl R. Palmer, Los Gatos, CA (US); Aditya Raina, San Jose, CA (US)

(73) Assignee: Windbond Electronics Corporation, Hsinchu (TW)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/501,699

(22) Filed: Feb. 10, 2000

(51) Int. Cl.$^7$ ............................................... H04L 12/28
(52) U.S. Cl. ...................... 370/419; 370/535; 370/537

(58) Field of Search ................................. 370/535, 537, 370/538, 539, 540, 419, 421, 422, 428, 429, 534, 111

(56) References Cited

U.S. PATENT DOCUMENTS

| 4,890,259 | A |   | 12/1989 | Simko ......................... 365/563 |
| 5,420,912 | A |   | 5/1995  | Kopp et al. .................. 455/563 |
| 5,664,060 | A | * | 9/1997  | Jarrett et al. ................ 704/270 |
| 5,726,934 | A | * | 3/1998  | Tran et al. ................ 365/185.2 |
| 5,801,980 | A | * | 9/1998  | Wong et al. .................. 365/45 |
| 5,828,592 | A | * | 10/1998 | Tran et al. .................... 365/45 |
| 6,208,542 | B1 | * | 3/2001 | Wang et al. .................. 365/45 |

FOREIGN PATENT DOCUMENTS

| EP | 0 865 046 A2 | 9/1998 |
| JP | WO 00/00983  | 1/2000 |

* cited by examiner

*Primary Examiner*—John Pezzlo
*Assistant Examiner*—Saba Tsegaye
(74) *Attorney, Agent, or Firm*—Blakely, Sokoloff, Taylor & Zafman LLP

(57) ABSTRACT

A multilevel analog recording and playback system is described. An analog processing circuit processes analog data. A storage circuit includes a non-volatile memory array, a switching circuit, and a communication interface. The non-volatile memory array stores analog and digital data. The switching circuit transfers the analog and digital data to and from the memory array. The communication interface allows a processor to exchange information with the device.

30 Claims, 5 Drawing Sheets

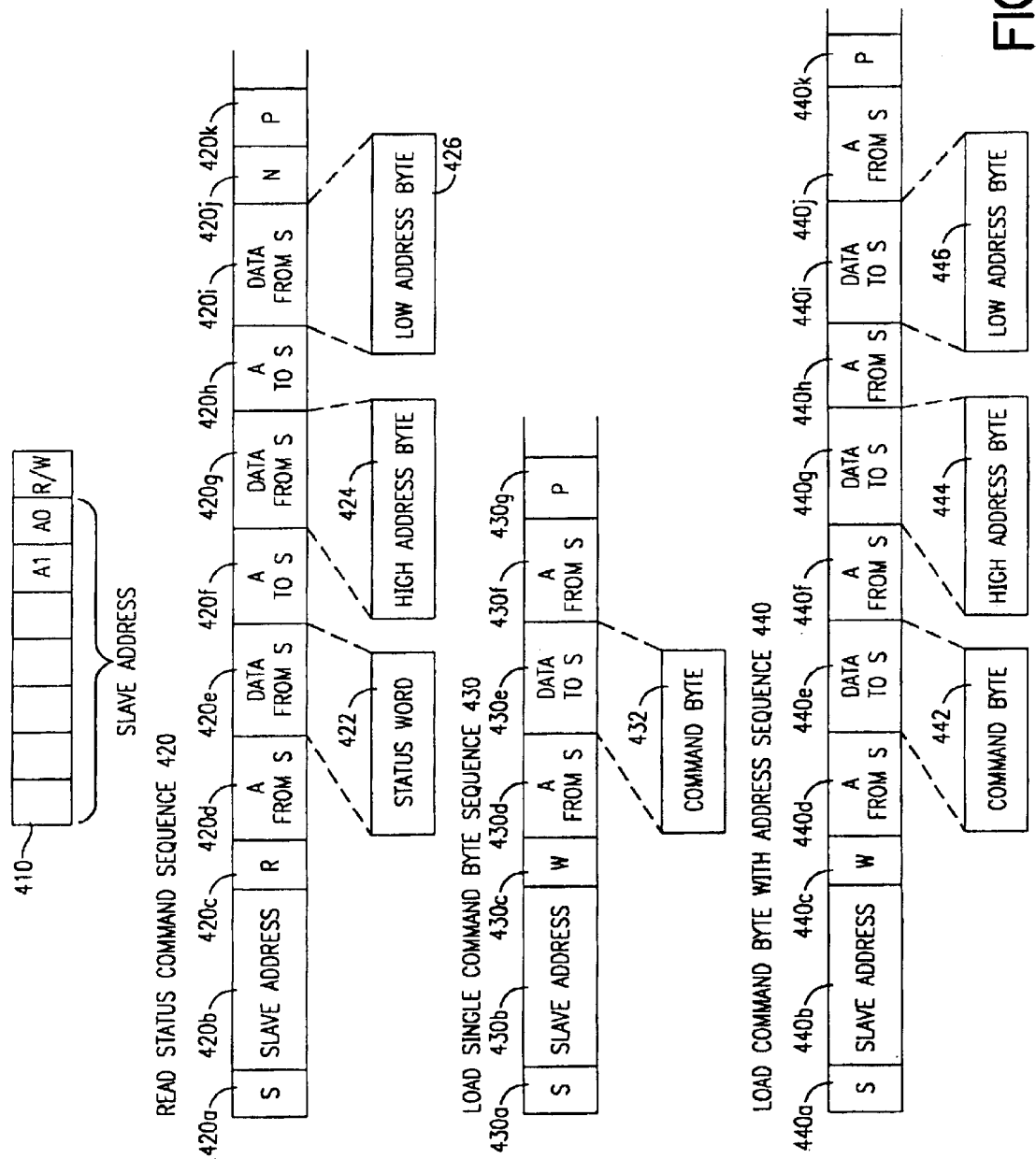

MULTIPLE MESSAGE MULTILEVEL ANALOG SIGNAL RECORDING AND PLAYBACK SYSTEM HAVING MEMORY ARRAY CONFIGURABLE FOR ANALOG AND DIGITAL STORAGE AND SERIAL COMMUNICATION

RELATED APPLICATION

The contents of the co-pending U.S. patent application Ser. No. 09/184,454 entitled "A multilevel message multilevel analog signal recording and playback system containing configurable analog processing functions", filed Nov. 2, 1998, assigned to the assignee of the present invention, are hereby incorporated by reference.

BACKGROUND OF THE INVENTION

1. Field of the Invention

The present invention relates generally to the field of integrated circuit design, and specifically, to signal recording and playback systems.

2. Background Information

The ISD 5008 device of Information Storage Devices, located in San Jose, Calif., represents a 3-volt serial interface family of voice recording and playback devices. This device is a fully integrated single-chip solution which provides seamless integration of enhanced voice features for digital cellular phones (GSM, CDMA, TDMA, PDC, and PHS), automotive communications, GPS/navigation systems, and portable communication products. The device enables customers to quickly and easily integrate 4 to 8 minutes of voice storage features such as one way and two-way (full duplex) call record, voice memo record, and call screening/answering machine functionality. The ISD5008 integrates the sampling clock, anti-aliasing and smoothing filters, and the multi-level storage array on a single chip.

However, the prior art devices can only store analog information. In many applications where digital data associated with voice processing functionalities are available (e.g., telephone book numbers, system configuration parameters, message address pointers), the prior art devices require additional digital storage devices with complicated external circuitry and interfacing (e.g., hardware and programming) effort. In addition, the prior art devices employ at least a 4-wire interface bus, causing increased pin count and complex interfacing circuitry to other devices and/or processors.

Therefore, there is a need to provide integrated digital and analog storage in a record and playback device having efficient bus interface.

SUMMARY OF THE INVENTION

A multilevel analog recording and playback system is described. An analog processing circuit processes analog data. A storage circuit includes a non-volatile memory array, a switching circuit, and a communication interface. The non-volatile memory array stores analog and digital data. The switching circuit transfers the analog and digital data to and from the memory array. The communication interface allows an external processor to exchange information with the device.

In one embodiment, the memory array includes a plurality of storage elements, each of the storage elements being configured to store one of the analog and digital data. The switching circuit includes a buffer and control circuit, an analog input selector, and a digital selector. The buffer and control circuit controls and buffers the analog and digital data in write and read cycles for data transfer with the memory array. The analog input selector is coupled to the buffer and control circuit, an analog processing circuit, and the communication interface to transfer the analog data from the analog processing circuit to the buffer and control circuit. The digital selector is coupled to the buffer and control circuit and the communication interface to transfer the digital data between the buffer and control circuit and the communication interface. The buffer and control circuit includes an input/output multiplexer and a program and read circuit. The input/output multiplexer transfers data into and out of the memory array. The program and read circuit is coupled to the input/output multiplexer to control programming and reading of the memory array. The analog input selector includes first and second sample and hold circuits operating in alternate manner to transfer analog input to the program/read circuit. The digital selector includes first and second registers operating in alternate manner. Each of the registers converts parallel digital data from the program/read circuit to serial data to the communication interface, and converts serial data from the communication interface to parallel digital data to the program/read circuit. The communication interface includes a serial port which is coupled to the processor for transferring serial data according to a serial communication protocol. The serial data includes the information including a command, a data, and a status. The command is one of a stop, an analog play, an analog play at a play address, an analog record, an analog record at a record address, an analog message cue, and analog message cue at a cue address, a digital read, a digital read at a read address, a digital write, a digital write at a write address, a digital erase, a up/down powering, an address load, and a configuration load. The status is one of an end of message (EOM) interrupt, a overflow interrupt, a ready, a power-up condition, a play/record indicator, and a device identification.

BRIEF DESCRIPTION OF THE DRAWINGS

FIG. 4 is a diagram illustrating communication sequence between a processor and the recording and playback system shown FIG. 1 according to one embodiment of the present invention.

DETAILED DESCRIPTION

A multilevel analog recording and playback system is described. An analog processing circuit processes analog data. A storage circuit includes a non-volatile memory array, a switching circuit, and a communication interface. The non-volatile memory array stores analog and digital data. The switching circuit transfers the analog and digital data to and from the memory array. The communication interface allows an external processor to exchange information with the device.

In one embodiment, the memory array includes a plurality of storage elements, each of the storage elements being configured to store one of the analog and digital data. The switching circuit includes a buffer and control circuit, an analog input selector, and a digital selector. The buffer and control circuit controls and buffers the analog and digital data in write and read cycles for data transfer with the memory array. The analog input selector is coupled to the buffer and control circuit, an analog processing circuit, and the communication interface to transfer the analog data from the analog processing circuit to the buffer and control circuit. The digital selector is coupled to the buffer and control circuit and the communication interface to transfer the digital data between the buffer and control circuit and the communication interface. The buffer and control circuit includes an input/output multiplexer and a program and read circuit. The input/output multiplexer transfers data into and out of the memory array. The program and read circuit is coupled to the input/output multiplexer to control programming and reading of the memory array. The analog input selector includes first and second sample and hold circuits operating in alternate manner to transfer analog input to the program/read circuit. The digital selector includes first and second registers operating in alternate manner. Each of the registers converts parallel digital data from the program/read circuit to serial data to the communication interface, and converts serial data from the communication interface to parallel digital data to the program/read circuit. The communication interface includes a serial port which is coupled to the processor for transferring serial data according to a serial communication protocol. The serial data includes the information including a command, a data, and a status. The command is one of a stop, an analog play; an analog play at a play address, an analog record, an analog record at a record address, an analog message cue, and analog message cue at a cue address, a digital read, a digital read at a read address, a digital write, a digital write at a write address, a digital erase, a up/down powering, an address load, and a configuration load. The status is one of an end of message (EOM) interrupt, a overflow interrupt, a ready, a power-up condition, a play/record indicator, and a device identification.

Figure 1:
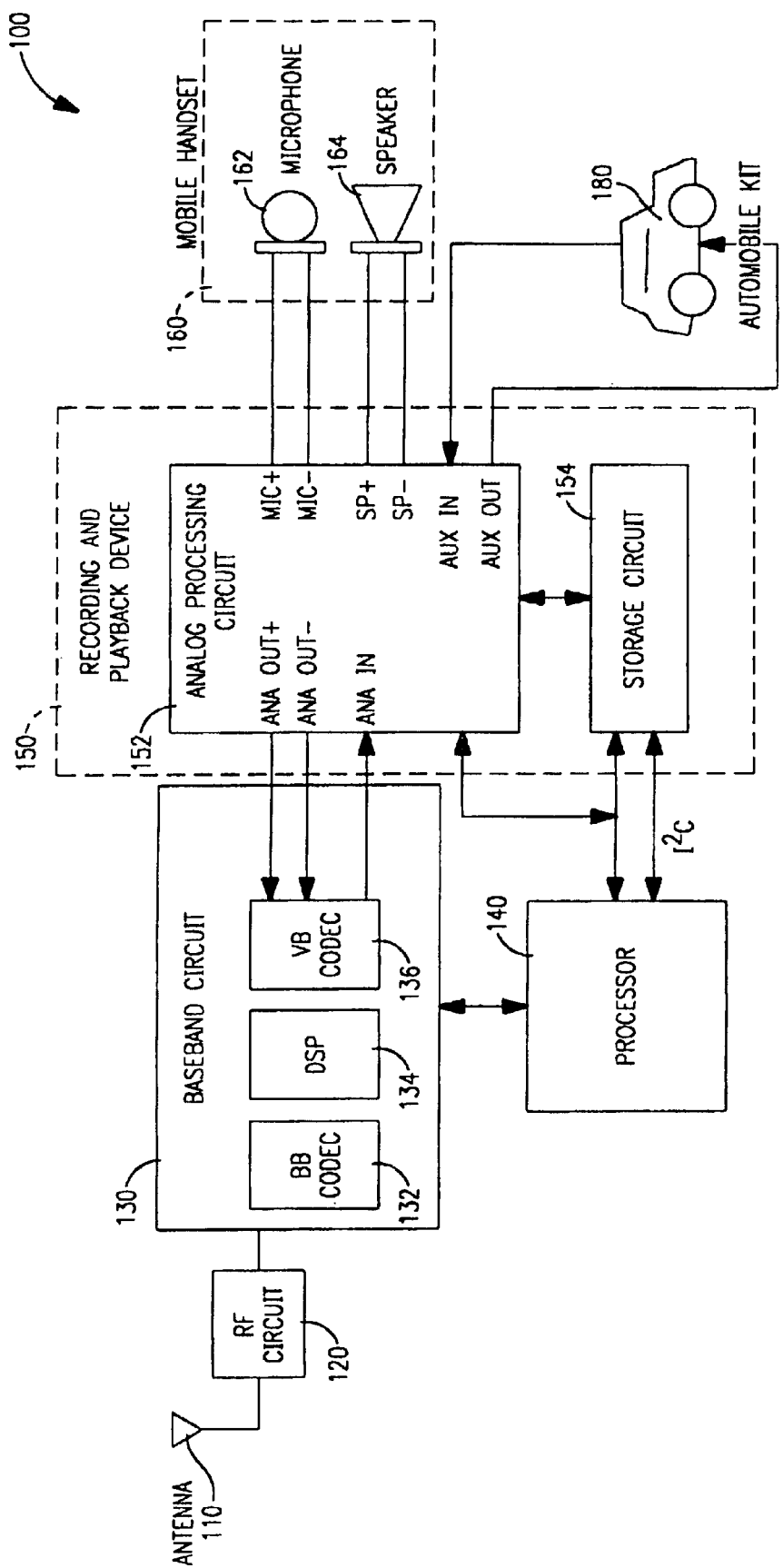
FIG. 1 is a diagram illustrating an exemplary system incorporating a recording and playback system according to one embodiment of the present invention.

FIG. 1 is a diagram illustrating an exemplary system 100 incorporating a recording and playback system according to one embodiment of the present invention. The exemplary system 100 is a mobile communication system. However, in other embodiments, the recording and playback system may be incorporated in, for example, telephone answering machines, cordless telephones, personal recorders, etc., to name a few. The system 100 includes an antenna 110, a radio frequency (RF) circuit 120, a baseband circuit 130, a processor 140, a recording and playback device 150, a mobile telephone handset 160, and an automobile kit 180.

The antenna 110 receives and transmits RF signals. The RF circuit 120 performs RF signal processing such as down conversion, filtering, and power amplification. The baseband circuit 130 performs signal processing functions at the baseband frequency. The baseband circuit 130 includes a baseband coder/decoder (BB CODEC) 132, a digital signal processor (DSP) 134, and a voiceband coder/decoder (VB CODEC) 136. The BB CODEC 132 interfaces with the RF circuit 120. The DSP 134 performs digital signal processing functions on the baseband signals from the BB CODEC 132 and VB CODEC 136. The VB CODEC 136 interfaces with the recording and playback device 150 for receiving and transmitting voice band signals. Analog-to-digital and digital-to-analog conversions are performed at appropriate places in the baseband circuit 130.

The processor 140 communicates with the baseband circuit and the recording and playback device to perform a number of functions such as control, monitoring, and configuration. The processor 140 is typically a microcontroller with sufficient program and data storage.

The recording and playback device 150 is an analog and digital subsystem that performs various analog signal processing functions, analog recording, analog playback, and digital storage. The recording and playback device 150 includes an analog processing circuit 152 and a storage circuit 154. In one embodiment, the recording and playback device 150 is implemented in a single integrated circuit.

The analog processing circuit 152 provides analog outputs (ANA OUT+ and ANA OUT−), an analog input (ANA IN), microphone outputs (MIC+ and MIC−), speaker outputs (SP+ and SP−), an auxiliary output (AUX OUT) and an auxiliary input (AUX IN). The ANA OUT+ and ANA OUT− are coupled to the microphone inputs (MIC IN+ and MIC IN−) of the baseband circuit 130. The ANA IN is coupled to the speaker output (either SP OUT+ or SP OUT−) of the baseband circuit 130. The mobile telephone handset 160 includes a microphone 162 and a speaker 164. The MIC+ and MIC− are coupled to the microphone 162 and the SP+ and SP− are coupled to the speaker 164. The AUX IN and AUX OUT are interfaced to the automobile kit 180. The automobile kit 180 is the base portion of a mobile communication system that is installed in a vehicle. By way of example, a user may communicate to a remote caller by using the handset 160 or alternatively, the automobile kit interface 180. As herein described, downstream refers to communication originating from a remote location that is received from the antenna 110, through the baseband circuit 130, and to the device 150. On the other hand, upstream refers to communication originated from the handset 160 or the automobile kit interface 180, through the baseband circuit 130, the antenna 110, and to the remote location. The analog processing circuit 152 includes analog circuitry that provides multiple input and output paths, core analog processing sections, and volume control circuit. In one embodiment, the analog processing circuit 152 is described in the co-pending U.S. patent application Ser. No. 09/184,454 entitled "A multilevel message multilevel analog signal recording and playback system containing configurable analog processing functions", filed Nov. 2, 1998, assigned to the assignee of the present invention.

The storage circuit 154 stores analog and digital data. The storage circuit 154 is interfaced to the analog processing circuit 152 and the processor 140. The storage circuit 154 stores analog data as processed by the analog processing circuit 152, and digital data as transferred from the processor 140 via a communication interface to be described in more detail later. The communication interface allows the processor 140 to exchange information with the recording and playback device 150. Examples of the information are commands, status, data, and addresses.

Figure 2:
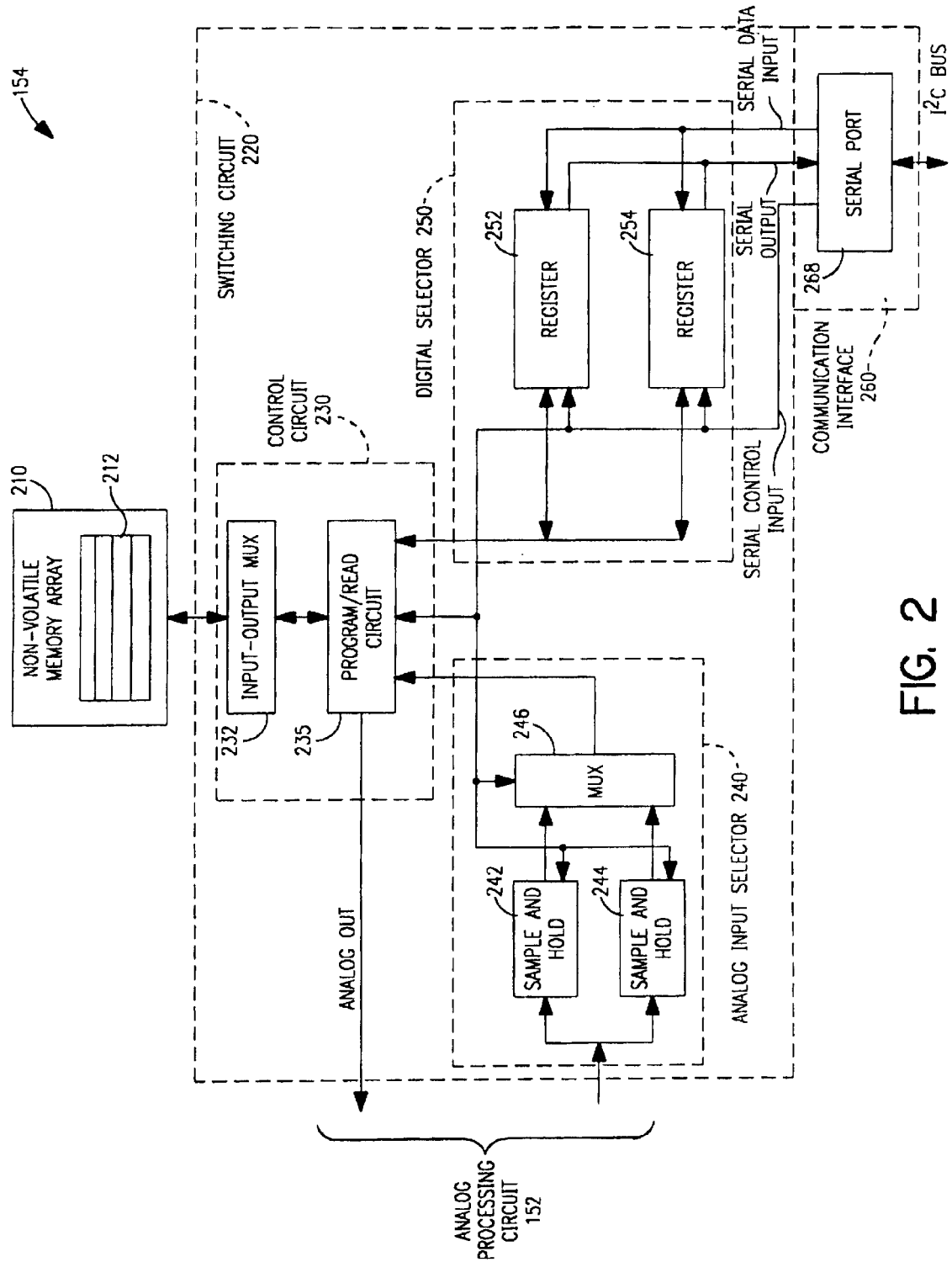
FIG. 2 is a diagram illustrating a storage circuit of FIG. 1 according to one embodiment of the present invention.

FIG. 2 is a diagram illustrating the storage circuit 154 of FIG. 1 according to one embodiment of the present invention. The storage circuit 154 includes a non-volatile memory array 210, a switching circuit 220, and a communication interface 260.

The non-volatile memory array 210 is configured to store analog data, digital data, or both. The memory array 210 includes a plurality of storage elements 212. In one embodiment, the storage elements are organized on a row by row basis. There is essentially no difference in the internal structure between the digital memory and analog memory.

The difference is the amount of charge stored in the memory cell. For digital storage, the memory cell is either fully charged (for one logical state, e.g., LOW) or fully discharged (for another logical state, e.g., HIGH). For analog storage, the amount of charge is between the fully charged and the fully discharged amounts according to the amplitude of the signal. Data sensing schemes are similar. Both digital and analog memories are sensed with a source follower configuration.

The switching circuit 220 receives and transmits analog and digital data to and from the memory array 210. The switching circuit 220 includes a control circuit 230, an analog input selector 240, and a digital selector 250. The control circuit 230 controls the programming and reading of the analog and digital data. The control circuit 230 includes an input/output multiplexer 232 and a program/read circuit 235. The input/output multiplexer 232 is coupled to the memory array 210 to provide input and output data paths, to steer data from the memory array 210 to the program/read circuit 235 in the read cycle, and to steer data from the program/read circuit 235 to the memory array 210 in the write cycle. The program/read circuit 235 provides control for the programming and reading of the memory array 210. In the program (or write) cycle, the program/read circuit 235 receives data from the analog input selector 240 and the digital selector 250 and selects one of the analog or digital data to transfer to the memory array 210 according to the control signal provided by the communication interface 260. In the read cycle, the program/read circuit 235 provides an analog output to the analog processing circuit 152 when operated in the analog mode, and provides a digital data to the digital selector 250 when operated in the digital mode.

The analog input selector 240 receives the analog input from the analog processing circuit 152 and generates an analog output to the program/read circuit 235. The analog input selector 240 includes two sample-and-hold circuits 242 and 244, and an analog multiplexer 246. The two sample-and-hold circuits 242 and 244 operate in an alternative mode so that data transfers to the memory array 210 can take place without delay. The analog multiplexer 246 selects one of the outputs of the two sample-and-hold circuits 242 and 244 to send to the program/read circuit 235. The analog multiplexer 246 may be replaced by a buffering circuit that enables one of the outputs of the two sample-and-hold circuits 242 and 244 at the appropriate timing instants. The operation of the analog input selector 240 is under control of the control signal sent from the communication interface 260.

The digital selector 250 is coupled to the communication interface 260 and the program/read circuit 235 and operates in read and write cycles. The digital selector 250 is controlled by a command from the communication interface 260. In the write cycle, the digital selector 250 receives the serial data from the communication interface 260 and generates parallel digital data to the program/read circuit 235. In the read cycle, the digital selector 250 receives the parallel digital data from the program/read circuit 235 and generates serial data output to the communication interface 260. The digital selector 250 includes two registers 252 and 254. Each of the registers 252 and 254 can perform parallel-to-serial and serial-to-parallel conversions and store data. The two registers 252 and 254 operate in an alternate fashion in both write and read cycles. For example, during the write cycle when one register is receiving data from the communication interface 260, the other register is available for transferring the previously loaded data to the program/read circuit 235. Similarly, during the read cycle, when one register is receiving data from the program/read circuit 235, the other register is available for sending data previously read from the program/read circuit 235 to the communication interface 260.

The communication interface 260 is coupled to the memory array 210, the analog processing circuit 152, and the switching circuit 220 to allow the processor 140 to exchange information with the device 150. The communication interface 260 provides a means for the processor 140 to send command, control, configuration information and digital data to the device 150 and to receive the status and the addressed contents of memory array 210. The communication interface 260 includes a serial port 268 and other buffering devices.

The serial port 268 is coupled to the processor 140 (FIG. 1) for transferring serial data according to a serial communication protocol. The serial data includes the information. In one embodiment, the serial communication protocol follows an $I^2C$ interface. The $I^2C$ interface is described in the document titled "The $I^2C$-bus specification, Version 2.0" published by Philips Semiconductor in December 1998. The information includes a command, a data, and a status.

Figure 3:
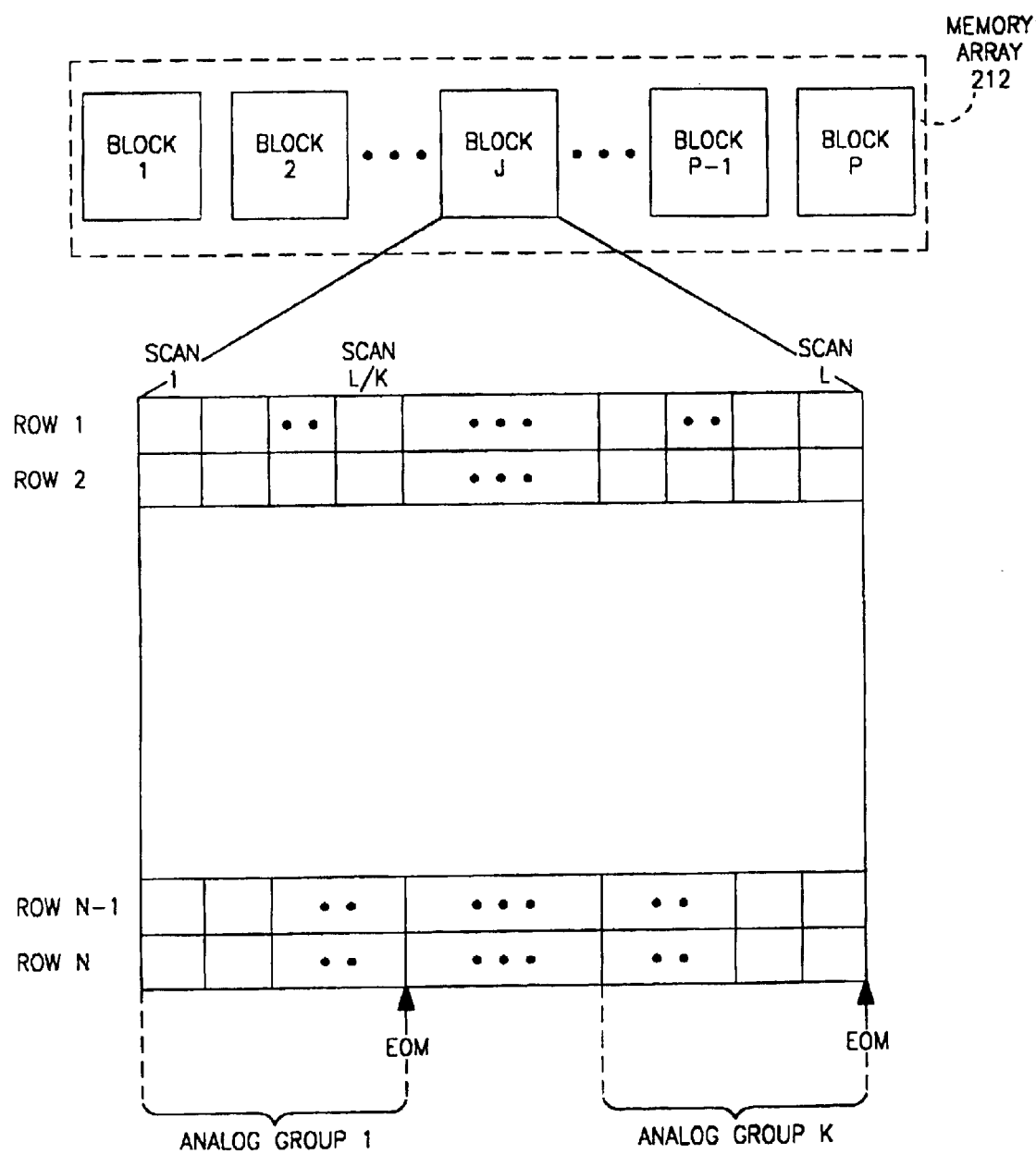
FIG. 3 is a diagram illustrating memory organization of the memory array shown in FIG. 2 according to one embodiment of the present invention.

FIG. 3 is a diagram illustrating a memory organization 300 of the memory array shown in FIG. 2 according to one embodiment of the present invention. The memory array is organized as P blocks. Each block includes N rows of storage elements. Each row includes L scans. Each scan corresponds to M-bit data. The contents of a row are either analog or digital and are determined by the instruction, or opcode, at the time the data is written as will be described later. Typically, the processor 140 (FIG. 1) keeps track of what is analog and what is digital in a message address table as part of a memory management scheme.

For analog storage, each row is addressed by $\log_2 N$ bits of address data. Each row is further divided into K groups where each group includes L/K scans. In each row, there are K end of message (EOM) positions, i.e., for each L/K scans, there is an EOM position at the end. Thus, when recording, the analog recording stops at any one of the L/K positions. In one embodiment, P=64, N=2048, L=32, M=64, and K=8. For a sampling rate of 8 KHz, each row contains 256 milliseconds (msec) of analog signal (e.g., audio). This also results in a resolution of 32 msec when ending an analog recording. Beginning an analog recording is limited to the 256 msec resolution provided by the 11-bit address.

For digital storage, in addition to the $\log_2 N$ bits for row addressing, five more bits of address data are needed to address the individual digital scans. Therefore, 16-bit address data is used to address a storage location and each location corresponds to an M-bit digital data.

FIG. 4 is a diagram illustrating basic communication sequences between the processor 140 and the recording and playback device 150 shown FIG. 1 according to one embodiment of the present invention.

The recording and playback device 150 is a slave in a system having multiple slaves connecting to the communication bus interface of the processor 140. In such a system, each slave is assigned an address, referred to as a slave address, shown as slave address 410. In one embodiment, the slave address 410 includes 7 bits. The five most significant address bits are fixed, e.g., 10000. The least two significant address bits, A1 and A0, are provided by the individual recording and playback device 150. The slave address is typically transferred in conjunction with a R/W bit to indicate whether the mode, or cycle, is a read mode or a rite mode. Typically, 8 bits are transferred as a unit, therefore, the R/W bit is transferred together with the 7-bit slave address.

In one embodiment, the communication bus interface is the I²C serial interface. The I²C bus interface is a serial interface requiring only two wires, a serial clock (SCL) and a serial data (SDA). The serial information transmitted over the I^C bus consists of a sequence of data. The master (e.g., the processor 140) and the slave (e.g., the recording and playback device 150) communicates with each other through a number of handshaking signals, conditions, or tokens. From the master to slave, the conditions include a START (S) condition, an acknowledgment to slave (A TO S), a STOP (P) condition, an 8-bit DATA (DATA TO S) transfer, a READ (R) bit, a WRITE (W) bit, and a NO ACK (N) bit. The R bit is a logical 1 in the R/W bit and the W bit is a logical 0 in the R/W bit. From the slave to the master, the conditions include an 8-bit DATA (DATA FROM S) transfer, and an acknowledgment from slave (A FROM S).

FIG. 4 illustrates three typical communication sequences between the processor 140 and the recording and playback device 150: a read status sequence 420, a load single command byte sequence 430, and a load command byte with address sequence 440. In the following description, the term "host" refers to the master (e.g., the processor 140), and the term "slave" refers to the slave in the system (e.g., the recording and playback device 150)

The read status sequence 420: The read status is a read request from the host to the slave without delivering a command byte. The host supplies all the clocks (SCL). In each case, the entity sending the data drives the data line (SDA). The read status command is executed by the I²C sequence 420. The sequence 420 includes S (420*a*), SLAVE ADDRESS (420*b*), R (420*c*), A FROM S (420*d*), DATA FROM S (420*e*), A TO S (420*f*), DATA FROM S (420*g*), A TO S (420*h*), DATA FROM S (420I), N (420*j*), and P (420*k*). The sequence 420 is explained as follows.

1. Host executes an I²C START (420*a*).
2. Host sends slave address with R/W bit="1" for READ (420*b*, 420*c*).
3. Slave responds back to host an acknowledge (ACK) followed by an 8-bit status word 422 (420*d*, 420*e*).
4. Host sends an acknowledge (ACK) to slave (420*f*).
5. Wait for SCL to go HIGH.
6. Slave responds with a high address byte 424 of internal address register (420*g*).
7. Host sends an acknowledge (ACK) to slave (420*h*).
8. Slave responds with a low address byte 426 of internal address register (420*i*).
9. Host sends a NO ACK to slave, and then executes an I²C STOP (420*j*, 420*k*).

Note that the host could have sent an after the Status word data transfer and aborted the transfer of the address bytes.

Load single command byte sequence 430: A single byte may be written to the command byte register in order to power up the device, start or stop the analog record (if no address is needed), or do a message cueing function. The sequence 430 includes S (430*a*), SLAVE ADDRESS (430*b*), W (430*c*) A FROM S (430*d*), DATA TO S (430*e*), A FROM S (430*f*), and P (430*g*). The sequence 430 is explained as follows.

1. Host executes an I²C START (430*a*).
2. Host sends slave address with R/W bit="0" for WRITE (430*b*, 430*c*).
3. Slave responds back to host an acknowledge (ACK) (430*d*).
4. Host sends a command byte 432 to slave (430*e*).
5. Slave responds with an acknowledge (ACK) (430*f*).
6. Host executes an I²C STOP (430*g*).

Load command byte with address sequence 440: The load sequence 440 provides the normal addressed mode. The sequence 440 includes S (440*a*), SLAVE ADDRESS (440*b*), W (440*c*), A FROM S (440*d*), DATA TO S (440*e*), A FROM S (440*f*), DATA TO S (440*g*), A FROM S (440*h*), DATA TO S (440*i*), A FROM S (440*j*), and P (440*k*). The sequence 440 is explained as follows.

1. Host executes an I²C START (430*a*).
2. Host sends slave address with R/W bit="0" for WRITE (440*b*, 440*c*).
3. Slave responds with an acknowledge (ACK) (440*d*).
4. Host sends a command byte 432 to slave (440*e*).
5. Slave responds with an acknowledge (ACK) (440*f*).
6. Host sends a high address byte 444 to slave (440*g*).
7. Slave responds with an acknowledge (ACK) (440*h*).
8. Host sends a low address byte 446 to slave (440*i*).
9. Slave responds with an acknowledge (ACK) (440*j*).
10. Host executes an I²C STOP (440*k*).

In the I²C write mode, the device can accept data sent after the command byte. If a register load option is selected, the next two bytes are loaded into the selected register. The format of the data is MSB first. Thus, to load DATA<15:0> into the device, DATA<15:8> is sent first, the byte is acknowledged, and DATA<7:0> is sent next. The address register consists of two bytes with the following format:

ADDRESS<15:0>=ROW ADDRESS<10:0>, SCAN ADDRESS<4:0>

If an analog function is selected, the scan address bits are ignored. Note that digital read and write are scan addressable.

Figure 5A:
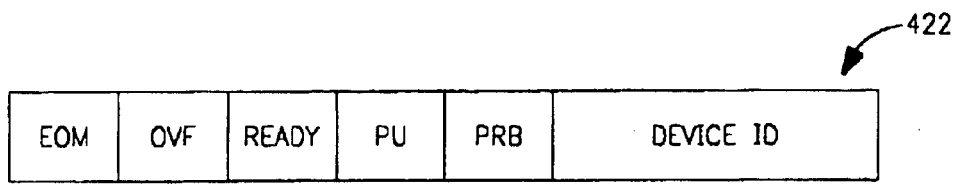
FIG. 5A is a diagram illustrating a status word format according to one embodiment of the present invention.

FIG. 5A is a diagram illustrating format of the status word 422 shown in FIG. 4 according to one embodiment of the present invention. When the slave (e.g., the recording and playback device 150 in FIG. 1) is polled with the read status command as illustrated in FIG. 4, it returns three bytes of data. The first byte is the status byte, the next is the upper address byte, and the last is the lower address byte. The status word 422 includes an end of message (EOM), an overflow (OVF), a ready (READY), a power up (PU) condition, a play/record mode indicator (PRB), and a device identification (DEVICE ID).

The EOM bit indicates whether an EOM interrupt has occurred. The OVF bit indicates whether an overflow interrupt has occurred. The READY bit indicates the internal status of the device. If READY is LOW, no new commands should be sent to the device. The PU bit indicates if the device is powered up (PU=HIGH). The PRB indicates if the device is in a play mode (PRB=HIGH) or record mode (PRB=LOW). The DEVICE ID is 3-bit and indicates the internal device ID, which is a pre-defined bit pattern (e.g., 001).

Figure 5B:
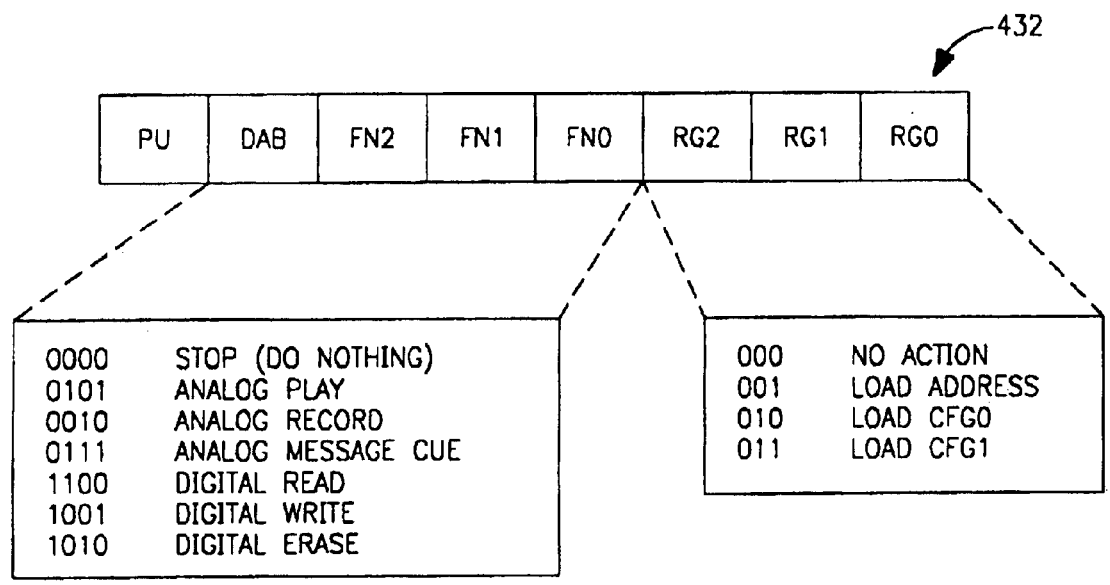
FIG. 5B is a diagram illustrating a command word format according to one embodiment of the present invention.

FIG. 5B is a diagram illustrating format of the command word 432 as shown in FIG. 4 according to one embodiment of the present invention. The command word 432 is used to control the device. The command word 432 is sent after the 7-bit device address and the 1-bit Read/Write selection bit as illustrated in FIG. 4. The command word 432 includes a power up bit (PU), a digital analog bit (DAB), three function bits (FN2, FN1, and FN0), and three register bits (RG2, RG1, and RG0).

The PU bit is used to provide global power up. The DAB bit is used to control the device to perform an analog or a digital function. The FN2–FN0 bits are used to specify which function the device is to perform in conjunction with the DAB bit. The RG2–RG0 bits are used to specify if and when data is to be loaded to a register. These bits are used as follows.

| DAB | FN2 | FN1 | FN0 | Function |
|-----|-----|-----|-----|----------|
| 0 | 0 | 0 | 0 | STOP (or do nothing) |
| 0 | 1 | 0 | 1 | Analog play |
| 0 | 0 | 1 | 0 | Analog record |
| 0 | 1 | 1 | 1 | Analog message cue |
| 1 | 1 | 0 | 0 | Digital read |
| 1 | 0 | 0 | 1 | Digital write |
| 1 | 0 | 1 | 0 | Digital erase |

The register load may be used to modify a command sequence (such as load an address) or used with the null command sequence to load a configuration or test register. Not all registers are accessible to the user.

| RG2 | RG1 | RG0 | Description |
|-----|-----|-----|-------------|
| 0 | 0 | 0 | No action |
| 0 | 0 | 1 | Load address |
| 0 | 1 | 0 | Load configuration register 0 (CFG0) |
| 0 | 1 | 1 | Load configuration register 1 (CFG1) |

Digital write: The digital write function allows the user to select a portion of the memory array to be used as digital memory. The partition between analog and digital memory is left up to the user. A row can either be digital or analog, but not both. In one embodiment, the minimum addressable block of memory is one scan or 64 bits. The address sent to the device is the 11-bit address row (or page) address with the 5-bit scan (or block) address. After the address is entered, the data is sent in one-byte packets followed by an I²C acknowledge generated by the device. Data for each block is sent with MSB first. The data transfer is ended when the master (e.g., the processor 140 in FIG. 1) generates an I²C STOP condition. If only a partial block of data is sent before the STOP condition, zero is "written" in the remaining bytes; that is, they are left at the erase level. An erased page (or row) is read as all zeros. The device can buffer up to two blocks of data. If the device is unable to accept more data due to the internal write process, the SCL line on the serial bus will be held low indicating to the master to halt the data transfer. For a 32 msec cycle, the sustained write rate is 2 Mbits/s. If the device encounters an overflow condition, it responds by generating an interrupt condition and an I²C Not Acknowledge signal after the last valid byte of data. Once data transfer is terminated, the device needs up to two cycles (64 msec) to complete its internal write cycle before another command is sent. If an active command is sent before the internal cycle is finished, the device will hold the SCL line low until the current command is finished.

A sequence to write data to the slave device from the host is as follows.

1. Host executes an I²C START
2. Host sends slave address with R/W bit=0 for WRITE
3. Slave responds with an ACK
4. Wait for SCL HIGH
5. Host sends a command byte to slave
6. Slave responds with an ACK
7. Wait for SCL HIGH
8. Host sends high address byte to slave
9. Slave responds with an ACK
10. Wait for SCL HIGH
11. Host sends low address byte to slave
12. Slave responds with an ACK
13. Wait for SCL HIGH
14. Host sends data byte to slave
15. Slave responds with an ACK
16. Wait for SCL HIGH
17. Steps 14, 15, and 16 are repeated until the last byte is send and acknowledged.

Digital read: The digital read command utilizes a combined I²C command format. In this combined format, a command is sent to the slave device (e.g., the record and playback device 150 shown in FIG. 1) using the write data direction, then the data direction is reversed by sending a repeated start condition, which consists of a repeated start, and the slave address with R/W set to 1. After this, the device begins to send data to the master until the master generates a Not Acknowledge. If the device encounters an overflow condition, an interrupt is generated.

A typical sequence for a digital read from the slave device is as follows.

1. Host executes an I²C START
2. Host sends slave address with R/W bit=0 for WRITE
3. Slave responds with an ACK
4. Host sends a command byte to slave
5. Slave responds with an ACK
6. Host sends high address byte to slave
7. Slave responds with an ACK
8. Host sends low address byte to slave
9. Slave responds with an ACK
10. Host sends another I²C START
11. Host sends slave address with R/W bit=1 (Reverse data direction)
12. Slave responds with an ACK
13. Slave sends a data byte to host
14. Host responds with an ACK
15. Steps 12 and 13 are repeated until the last byte is sent and acknowledged
16. Host executes an I²C STOP.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A storage circuit in a device comprising:
   a non-volatile memory array to store analog and digital data;
   a switching circuit coupled to the memory array to transfer the analog and digital data to and from the memory array, the switching circuit comprising a digital selector, the digital selector including first and second registers operating in alternate manner during read and write cycles; and
   a communication interface coupled to the memory array, and the switching circuit to allow a processor to exchange information with the device, the information including a status in response to a request from the processor.

2. The storage circuit of claim 1 wherein the memory array comprises:
a plurality of storage elements, each of the storage elements being configured to store one of the analog and digital data.

3. The storage circuit of claim 1 wherein the switching circuit further comprises:
a buffer and control circuit to control and buffer the analog and digital data in write and read cycles for data transfer with the memory array;
an analog input selector coupled to the buffer and control circuit, an analog processing circuit, and the communication interface to transfer the analog data from the analog processing circuit to the buffer and control circuit; and
wherein the digital selector is coupled to the buffer and control circuit and the communication interface to transfer the digital data between the buffer and control circuit and the communication interface via the first and second registers.

4. The storage circuit of claim 3 wherein the buffer and control circuit comprises:
an input/output multiplexer to transfer data into and out of the memory array;
a program and read circuit coupled to the input/output multiplexer to control programming and reading of the memory array.

5. The storage circuit of claim 3 wherein the analog input selector comprises:
first and second sample and hold circuits operating in alternate manner to transfer analog input to the program/read circuit.

6. The storage circuit of claim 5 wherein the information further includes a command and a data.

7. The storage circuit of claim 6 wherein the command is one of a stop, an analog play, an analog play at a play address, an analog record, an analog record at a record address, an analog message cue, and analog message cue at a cue address, a digital read, a digital read at a read address, a digital write, a digital write at a write address, a digital erase, a up/down powering, an address load, and a configuration load.

8. The storage circuit of claim 7 wherein the status is one of an end of message (EOM) interrupt, a overflow interrupt, a ready, a power-up condition, a play/record indicator, and a device identification.

9. The storage circuit of claim 3 wherein
each of the first and second registers converts parallel digital data from the program/read circuit to serial data to the communication interface and converts serial data from the communication interface to parallel digital data to the program/read circuit.

10. The storage circuit of claim 1 wherein the communication interface comprises:
a serial port coupled to the processor for transferring serial data according to a serial communication protocol, the serial data including the information.

11. A recording and playback device, comprising:
an analog processing circuit to process analog data; and
a storage circuit comprising:
a non-volatile memory array to store analog and digital data,
a switching circuit coupled to the memory array to transfer the analog and digital data to and from the memory array the switching circuit comprising a digital selector, the digital selector including first and second registers operating in alternate manner during read and write cycles, and
a communication interface coupled to the memory array and the switching circuit to allow a processor to exchange information with the device, the information including a status in response to a request from the processor.

12. The recording and playback device of claim 11 wherein the memory array comprises:
a plurality of storage elements, each of the storage elements being configured to store one of the analog and digital data.

13. The recording and playback device of claim 11 wherein the switching circuit further comprises:
a buffer and control circuit to control and buffer the analog and digital data in write and read cycles for data transfer with the memory array;
an analog input selector coupled to the buffer and control circuit, an analog processing circuit, and the communication interface to transfer the analog data from the analog processing circuit to the buffer and control circuit; and
wherein the digital selector is coupled to the buffer and control circuit and the communication interface to transfer the digital data between the buffer and control circuit and the communication interface via the first and second registers.

14. The recording and playback device of claim 13 wherein the buffer and control circuit comprises:
an input/output multiplexer to transfer data into and out of the memory array;
a program and read circuit coupled to the input/output multiplexer to control programming and reading of the memory array.

15. The recording and playback device of claim 13 wherein the analog input selector comprises:
first and second sample and hold circuits operating in alternate manner to transfer analog input to the program/read circuit.

16. The recording and playback device of claim 15 wherein the information further includes a command and a data.

17. The recording and playback device of claim 16 wherein the command is one of a stop, an analog play, an analog play at a play address, an analog record, an analog record at a record address, an analog message cue, and analog message cue at a cue address, a digital read, a digital read at a read address, a digital write, a digital write at a write address, a digital erase, a up/down powering, an address load, and a configuration load.

18. The recording and playback device of claim 17 wherein the status is one of an end of message (EOM) interrupt, a overflow interrupt, a ready, a power-up condition, a play/record indicator, and a device identification.

19. The recording and playback device of claim 13 wherein
each of the first and second registers converts parallel digital data from the program/read circuit to serial data to the communication interface and converts serial data from the communication interface to parallel digital data to the program/read circuit.

20. The recording and playback device of claim 11 wherein the communication interface comprises:
a serial port coupled to the processor for transferring serial data according to a serial communication protocol, the serial data including the information.

21. A mobile communication system comprising:
a baseband circuit;
a processor coupled to the baseband circuit; and
a recording and playback device coupled to the baseband circuit and the processor, comprising:
an analog processing circuit to process analog data, and
a storage circuit, the storage circuit comprising:
a non-volatile memory array to store analog and digital data,
a switching circuit coupled to the memory array to transfer the analog and digital data to and from the memory array, the switching circuit comprising a digital selector, the digital selector including first and second registers operating in alternate manner during read and write cycles, and
a communication interface coupled to the memory array and the switching circuit to allow the processor to exchange information with the device, the information including a status in response to a request from the processor.

22. The mobile communication system of claim 21 wherein the memory array comprises:
a plurality of storage elements, each of the storage elements being configured to store one of the analog and digital data.

23. The mobile communication system of claim 21 wherein the switching circuit comprises:
a buffer and control circuit to control and buffer the analog and digital data in write and read cycles for data transfer with the memory array;
an analog input selector coupled to the buffer and control circuit, an analog processing circuit, and the communication interface to transfer the analog data from the analog processing circuit to the buffer and control circuit; and
wherein the digital selector coupled to the buffer and control circuit and the communication interface to transfer the digital data between the buffer and control circuit and the communication interface via the first and second registers.

24. The mobile communication system of claim 23 wherein the buffer and control circuit comprises:
an input/output multiplexer to transfer data into and out of the memory array;
a program and read circuit coupled to the input/output multiplexer to control programming and reading of the memory array.

25. The mobile communication system of claim 23 wherein the analog input selector comprises:
first and second sample and hold circuits operating in alternate manner to transfer analog input to the program/read circuit.

26. The mobile communication system of claim 25 wherein the information further includes a command and a data.

27. The mobile communication system of claim 26 wherein the command is one of a stop, an analog play, an analog play at a play address, an analog record, an analog record at a record address, an analog message cue, and analog message cue at a cue address, a digital read, a digital read at a read address, a digital write, a digital write at a write address, a digital erase, a up/down powering, an address load, and a configuration load.

28. The mobile communication system of claim 27 wherein the status is one of an end of message (EOM) interrupt, a overflow interrupt, a ready, a power-up condition, a play/record indicator, and a device identification.

29. The mobile communication system of claim 23 wherein
each of the first and second registers converts parallel digital data from the program/read circuit to serial data to the communication interface and converts serial data from the communication interface to parallel digital data to the program/read circuit.

30. The mobile communication system of claim 21 wherein the communication interface comprises:
a serial port coupled to the processor for transferring serial data according to a serial communication protocol, the serial data including the information.

* * * * *

UNITED STATES PATENT AND TRADEMARK OFFICE
CERTIFICATE OF CORRECTION

PATENT NO. : 6,865,186 B1
DATED : March 8, 2005
INVENTOR(S) : Geoffrey B. Jackson et al.

It is certified that error appears in the above-identified patent and that said Letters Patent is hereby corrected as shown below:

Title page,
Item [75], Inventors, please add -- Douglas F. Horan, Los Gatos, CA (US) --.
Item [73], Assignee, please delete "Windbond" and insert -- Winbond --.

Signed and Sealed this

Twenty-first Day of June, 2005

JON W. DUDAS
*Director of the United States Patent and Trademark Office*